(12) United States Patent
Griswold et al.

(10) Patent No.: US 11,222,840 B2
(45) Date of Patent: Jan. 11, 2022

(54) SILICON-ON-INSULATOR (SOI) SUBSTRATE AND RELATED METHODS

(71) Applicant: SEMICONDUCTOR COMPONENTS INDUSTRIES, LLC, Phoenix, AZ (US)

(72) Inventors: Mark Griswold, Gilbert, AZ (US); Michael J. Seddon, Gilbert, AZ (US)

(73) Assignee: SEMICONDUCTOR COMPONENTS INDUSTRIES, LLC, Phoenix, AZ (US)

(*) Notice: Subject to any disclaimer, the term of this patent is extended or adjusted under 35 U.S.C. 154(b) by 0 days.

(21) Appl. No.: 16/929,397

(22) Filed: Jul. 15, 2020

(65) Prior Publication Data

US 2020/0350243 A1 Nov. 5, 2020

Related U.S. Application Data

(63) Continuation of application No. 15/961,642, filed on Apr. 24, 2018, now Pat. No. 10,741,487.

(51) Int. Cl.
*H01L 21/02* (2006.01)
*H01L 23/522* (2006.01)
*H01L 23/34* (2006.01)
*H01L 21/786* (2006.01)
*H01L 23/12* (2006.01)

(52) U.S. Cl.
CPC ...... *H01L 23/5222* (2013.01); *H01L 21/0226* (2013.01); *H01L 21/786* (2013.01); *H01L 23/12* (2013.01); *H01L 23/34* (2013.01)

(58) Field of Classification Search
CPC ............ H01L 23/5222; H01L 21/0226; H01L 21/786; H01L 23/12; H01L 23/34
USPC ......................................................... 257/712
See application file for complete search history.

(56) References Cited

U.S. PATENT DOCUMENTS

| 7,696,067 B2 | 4/2010 | Nakamura et al. | |
| 2004/0192006 A1* | 9/2004 | Campbell | H01L 45/143 438/382 |
| 2006/0057782 A1* | 3/2006 | Gardes | H01L 24/97 438/125 |
| 2008/0242052 A1 | 10/2008 | Feng et al. | |
| 2011/0059612 A1* | 3/2011 | Nakata | H01L 21/6835 438/691 |
| 2015/0179552 A1* | 6/2015 | Myung | H01L 23/49575 257/666 |
| 2018/0033739 A1* | 2/2018 | Seddon | H01L 21/02035 |

OTHER PUBLICATIONS

Silicon on insulator, Wikipedia, available at https://en.wikipedia.org/wiki/Silicon_on_insulator. Accessed on Mar. 22, 2018.

* cited by examiner

*Primary Examiner* — Didarul A Mazumder
(74) *Attorney, Agent, or Firm* — Adam R. Stephenson, Ltd.

(57) ABSTRACT

Implementations of a silicon-on-insulator (SOI) die may include a silicon layer including a first side and a second side, and an insulative layer coupled directly to the second side of the silicon layer. The insulative layer may not be coupled to any other silicon layer.

20 Claims, 3 Drawing Sheets

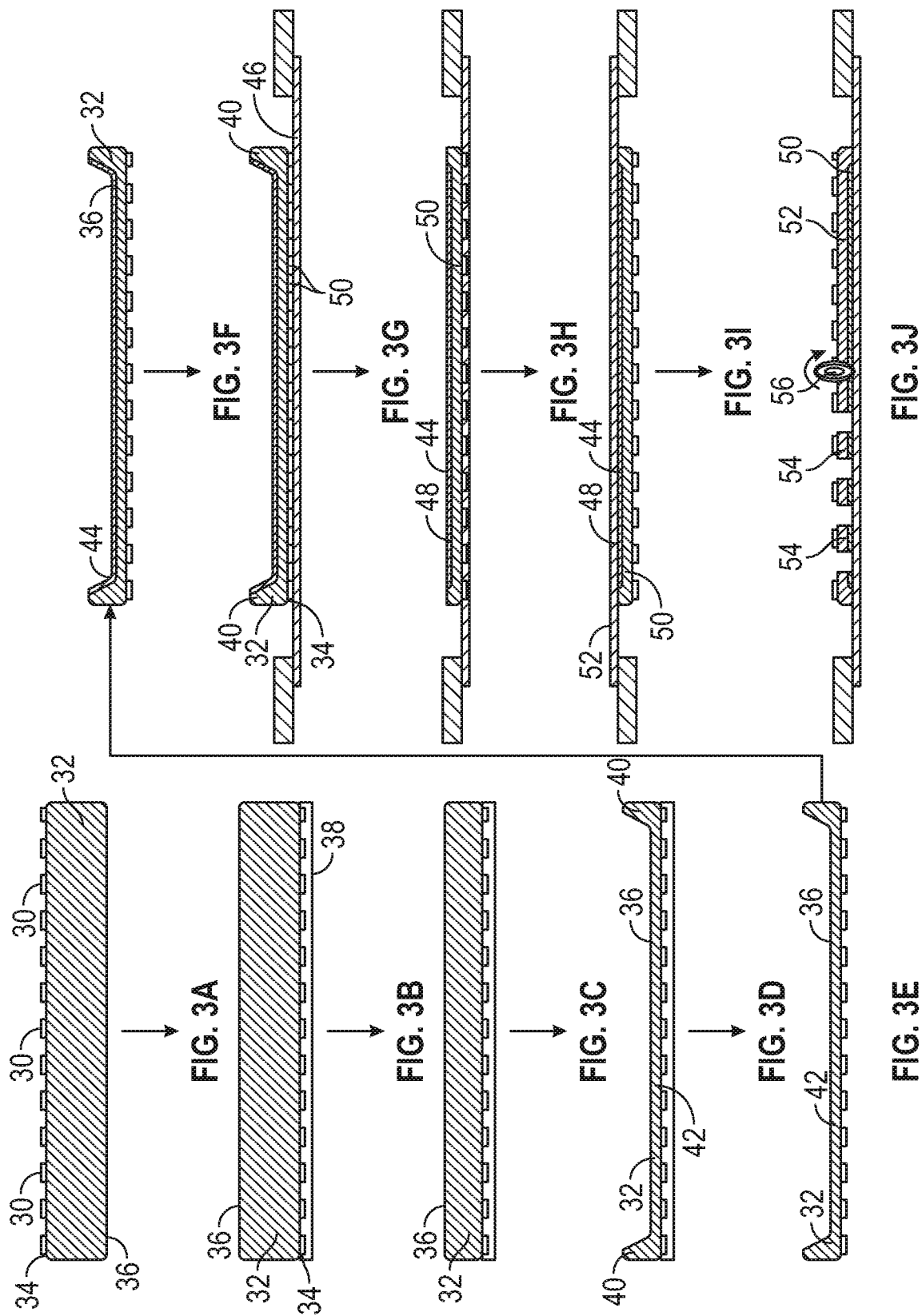

SILICON-ON-INSULATOR (SOI) SUBSTRATE AND RELATED METHODS

CROSS REFERENCE TO RELATED APPLICATIONS

This application is a continuation application of the earlier U.S. Utility Patent Application to Seddon et al., entitled, "SOT Substrate and Related Methods," application Ser. No. 15/961,642, filed Apr. 24, 2018, now pending, the disclosure of which is hereby incorporated entirely herein by reference.

BACKGROUND

1. Technical Field

Aspects of this document relate generally to semiconductor substrates. More specific implementations involve silicon-on-insulator (SOT) substrates.

2. Background

Silicon-on-insulator (SOT) substrates include a silicon junction above an electrical insulator. SOT substrates have been used to reduce capacitance.

SUMMARY

Implementations of a silicon-on-insulator (SOI) die may include a silicon layer including a first side and a second side, and an insulative layer coupled directly to the second side of the silicon layer. The insulative layer may not be coupled to any other silicon layer.

Implementations of an SOI die may include one, all, or any of the following:

The SOI die may include a plurality of semiconductor devices on the first side of the silicon layer.

The SOI die may include a conductive layer coupled directly to the second side of the silicon layer.

The silicon layer may be less than 35 micrometers (um) thick.

The insulative layer may include a thermally conductive material.

Implementations of methods of making an SOI die may include forming a ring around the perimeter of a second side of a silicon substrate through backgrinding the second side of the substrate to a desired substrate thickness, depositing an insulative layer onto the second side of the silicon substrate after backgrinding, removing the ring around the perimeter of the second side of the silicon substrate, and singulating the silicon substrate into a plurality of SOI die.

Implementations of methods of making an SOI die may include one, all, or any of the following:

The method may include forming a plurality of semiconductor devices on the first side of the silicon substrate, the first side opposite the second side of the silicon substrate.

The plurality of silicon die may be less than 35 um thick.

The method may further include stress relief etching the second side of the silicon substrate.

The insulative layer may be deposited using either co-evaporation or co-sputtering.

The method may further include dissipating heat through a heat dissipation device during deposition of the insulative layer.

The co-evaporation or co-sputtering may occur at temperatures that do not require heat dissipation.

The method may not include implanting hydrogen.

No sacrificial carrier substrate may be used in the method.

Implementations of methods of making an SOI die may include forming a ring around the perimeter of a second side of a silicon substrate through backgrinding the second side of the silicon substrate to a desired substrate thickness, depositing a conductive layer onto the second side of the silicon substrate, depositing an insulative layer over the conductive layer, removing the ring around the perimeter of the second side of the silicon substrate, and singulating the silicon substrate into a plurality of SOI die.

Implementations of methods of making an SOI die may include one, all, or any of the following:

The method may further include patterning the conductive layer.

The conductive layer may include titanium.

The silicon substrate may be thinned to less than 35 um.

The insulative layer may be deposited using either co-evaporation or co-sputtering.

Implementations of a silicon-on-insulator (SOI) die may only include a silicon layer including a first side and a second side, a semiconductor device coupled to the first side of the silicon layer, and an insulative layer coupled directly to the second side of the silicon layer. The insulative layer may not be coupled to any other silicon layer.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and:

FIGS. 3A-3J are cross sectional side views of an implementation of a method of forming an SOI die.

DESCRIPTION

This disclosure, its aspects and implementations, are not limited to the specific components, assembly procedures or method elements disclosed herein. Many additional components, assembly procedures and/or method elements known in the art consistent with the intended silicon-on-insulator (SOI) substrates and die will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such SOI substrates and die, and implementing components and methods, consistent with the intended operation and methods.

Figure 1:
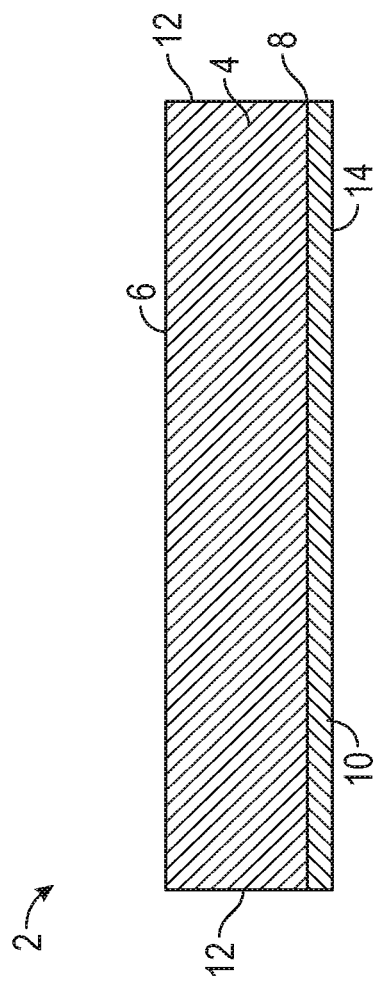
FIG. 1 is a cross sectional side view of a silicon-on-insulator (SOI) die.

Referring to FIG. 1, a cross sectional side view of an SOI die is illustrated. The SOI die 2 includes a silicon layer 4. The silicon layer 4 includes a first side 6 and a second side 8 opposite the first side. In various implementations, the silicon layer 4 may be, by non-limiting example, an epitaxial silicon layer, a polysilicon layer, a single crystal silicon layer, any combination thereof, or any other silicon-containing layer material. In other implementations, it is understood that a layer other than a silicon-containing layer may be used, such as, by non-limiting example, gallium arsenide, silicon carbide, or a metal-containing layer. While this disclosure primarily refers to silicon and SOI die, it is understood that the principles disclosed herein may be applied to other non-silicon containing die. In various implementations, one or more semiconductor devices may be coupled to the first side 6 of the silicon layer. In such implementations, the one or more semiconductor devices may include high voltage junction devices or power management devices, while in other implementations the one or more semiconductor devices may include other types of semiconductor devices.

In various implementations, the silicon layer 4 may be less than 35 micrometers (microns, um) thick. In other implementations, it may be 35 or more um thick. In particular implementations, the silicon layer 4 may be as thin as about 8 um thick. In implementations where the silicon layer 4 is to be used in medium voltage applications [100 volts (V) or 2 amps (A)], the silicon layer may be about 20-30 um thick. In other implementations where the silicon layer 4 is to be used in high voltage applications (1 kV, 10 A), the silicon layer may be greater than 100 um thick.

The SOI die also includes an insulative layer 10 coupled to the second side 8 of the layer 4. In various implementations, the insulative layer 10 may be coupled directly to the second side 8 of the layer 4. The insulative layer may include any electrical insulator, and in particular implementations, may include an electrical insulator which is thermally conductive. In particular implementations, the insulative layer may include, by non-limiting example, BN, AlN, $AlO_x$, $TiO_x$, $TiN_x$, $SiO_2$, sapphire (alpha-$Al_2O_3$), Mica, $Ta_2O_5$, diamond, $Si_xN_y$, SiC, GaN, graphene oxide, nanocomposite silicates, silicon rubber, a graphite polymer matrix, tungsten carbide, any other electrically insulative material, or any combination thereof. In implementations where the SOI die 2 is to be used in medium voltage applications [100 volts (V) or 2 amps], the insulative layer may be about 2,000-5,000 Angstroms (A) thick. In other implementations where the SOI die 2 is to be used in high voltage applications (1 kV, 10 amps), the insulative layer may be about 1 um thick. In other implementations, the insulative layer may be less than 2 kA thick or more than 1 um thick. In particular implementations, the thickness of the insulative layer may be 3 um or more thick.

In various implementations, and as illustrated by FIG. 1, the sidewalls of the insulative layer 10 may be a continuous layer coextensive with the sidewalls 12 of the silicon layer 4. In other implementations, the insulative layer 10 may be patterned. Though not illustrated by FIG. 1, in various implementations the SOI die 2 may include a conductive layer directly coupled to the second side 8 of the layer 4. In particular implementations, the conductive layer may be between the layer 4 and the insulative layer 10. In implementations where the insulative layer 10 is patterned, the conductive layer may fill the recesses in the insulative layer. The conductive layer may also be patterned. In implementations including a conductive layer, the conductive layer may include titanium, aluminum, copper, gold, silver nickel, any other metal, any alloy thereof, or any combination thereof.

In various implementations, the insulative layer 10 is not coupled to any other layer or silicon layer aside from the silicon layer 4. While various implementations of SOI die include a layer of silicon over an insulative layer over a second layer of silicon (or at least a portion of a second layer of silicon), the implementations of the SOI die disclosed herein may only include a single silicon layer. In such implementations, this may allow for the second side 14 of the insulative layer 10 to be fully exposed. In particular implementations, the SOI die may only include a silicon layer 4 having a first side 6 and a second side 8 and an insulative layer 10 directly coupled to the second side 8 of the silicon layer 4. The insulative layer 10 may be patterned in various implementations. In other implementations, the SOI die may only include a silicon layer having a first side and a second side, a semiconductor device coupled to or formed on/in the first side of the silicon layer, and an insulative layer coupled directly to the second side of the silicon layer. In still other implementations, the SOI die may only include a silicon layer having a first side and a second side, an insulative layer coupled to the second side of the silicon layer, and a conductive layer directly coupled to the second side of the silicon layer as well as the insulative layer.

Figure 2:
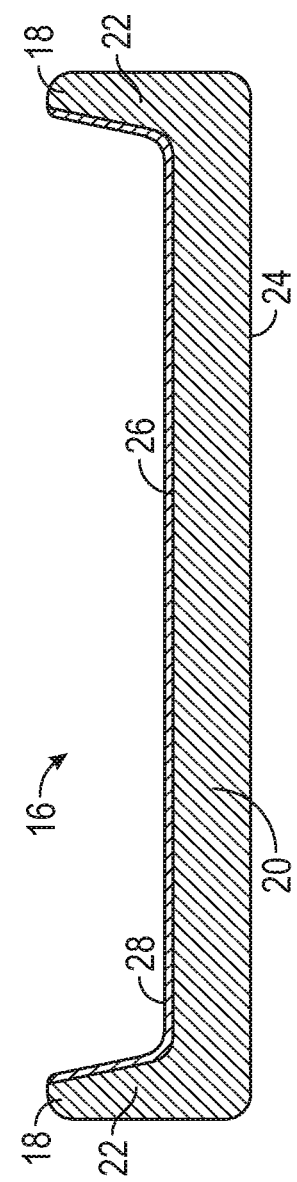
FIG. 2 is a cross sectional side view of an SOI substrate with a ring formed around the perimeter thereof.

Referring to FIG. 2, a cross sectional side view of an SOI substrate with a ring formed around the perimeter thereof is illustrated. In various implementations, the substrate 16 illustrated by FIG. 2 may be formed prior to forming the SOI die 2 illustrated by FIG. 1. The SOI substrate 16 includes a substrate 18 having a first side 24 and a second side 26. The substrate 18 may be, by non-limiting example, an epitaxial silicon substrate, a polysilicon substrate, single crystal silicon substrate, any combination thereof, or any other silicon-containing substrate material. In other implementations, it is understood that a substrate other than a silicon-containing substrate may be used, such as, by non-limiting example, gallium arsenide, silicon carbide, or a metal-containing substrate. While this disclosure primarily refers to silicon and SOI substrates, it is understood that the principles disclosed herein may be applied to other non-silicon containing substrates. As illustrated by FIG. 2, the substrate 18 includes a thinned portion 20 and a ring 22 extending around the perimeter of the substrate. The ring may result from backgrinding in a process marketed under the trade name TAIKO by DISCO of Tokyo, Japan. The thinned portion 20 of the substrate 18 may be less than 35 micrometers (um) thick. In other implementations, it may be 35 or more um thick. In particular implementations, the thinned portion 20 of the substrate 18 may be as thin as about 8 um thick. In other particular implementations, the thinned portion 20 of the substrate may be about 20-30 um thick.

The SOI substrate 16 includes an insulative layer 28 coupled to the second side 26 of the substrate 18. In various implementations, the insulative layer 28 may be coupled directly to the second side 26 of the substrate 18. The insulative layer may include any electrical insulator, and in particular implementations, may include an electrical insulator which is thermally conductive. In particular implementations, the insulative layer may include, by non-limiting example, BN, AlN, $AlO_x$, $TiO_x$, $TiN_x$, $SiO_2$, sapphire (alpha-$Al_2O_3$), Mica, $Ta_2O_5$, diamond, $Si_xN_y$, SiC, GaN, graphene oxide, nanocomposite silicates, silicon rubber, a graphite polymer matrix, tungsten carbide, any other electrically insulative material, or any combination thereof. In various implementations, the insulative layer 28 may be about 2,000-5,000 Angstroms (A) thick. In other implementations, the insulative layer 28 may be about 1 um thick. In still other implementations, the insulative layer 28 may be less than 2 kA thick, more than 1 um thick, or between 2 kA and 1 um thick. In particular implementations, the insulative layer may be 3 um or more than 3 um thick. In various implementations, and as illustrated by FIG. 2, the insulative layer 28 may be a solid and continuous layer covering the second side 26 of the substrate 18. In other implementations, the insulative layer 28 may be patterned. In various implementations, the insulative layer 28 is not coupled to any other substrate aside from the substrate 18.

In various implementations, the SOI substrate 16 may also include a conductive layer coupled to the insulative layer 28 and to the second side 26 of the substrate 18 (not illustrated in FIG. 2). In various implementations, the conductive layer may be directly coupled to the second side 26 of the substrate 18. In particular implementations, the conductive layer may be between the substrate 18 and the insulative layer 28. In implementations including a conductive layer, the conductive layer may any type of material previously disclosed herein and may or may not be patterned.

Referring to FIGS. 3A-3J, cross sectional side views of a substrate at various points of a method for forming an SOI die is illustrated. Referring specifically to FIG. 3A, the method for forming an SOI die may include forming a plurality of semiconductor devices 30 on, or coupling a plurality of semiconductor devices 30 to, a first side 34 of a substrate 32. While FIGS. 3A-3J indicate that the plurality of semiconductor devices 30 are formed on the substrate 32 before thinning the substrate and/or before applying an insulative layer, in other implementations, the plurality of semiconductor devices may be formed on the substrate after thinning the substrate and/or after applying an insulative layer to the substrate. The plurality of semiconductor devices may be any type of semiconductor device disclosed herein.

Referring to FIG. 3B, the method for forming an SOI die may include applying backgrind tape 38 to the first side 34 of the substrate 32. Referring to FIG. 3C, the method may also include initially thinning the substrate 42. In various implementations, the substrate may be initially thinned to about 355 um, though in other implementations the substrate may be thinned to more or less than this thickness. The substrate 32 may be thinned through backgrinding, etching, or any other thinning technique.

Referring to FIG. 3D, the method for forming an SOI die includes forming a ring 40 around the perimeter of a second side 36 of a substrate 32 through backgrinding the second side of the substrate 32 to a desired substrate thickness. In particular implementations, the backgrinding may use a process marketed under the trade name TAIKO by DISCO Corporation of Tokyo, Japan. The backgrinding leaves a ring of non-removed material (TAIKO ring) along the perimeter of the second side 36 of the substrate 32 which helps to prevent the substrate from curling, warping or otherwise bending during further processing while at the same time removing most of the thickness and material of the second side 36 of the substrate 32. The ring 40 may also offer sufficient stress management for the insulative layer applied to the substrate as described later herein. In other implementations of methods of forming semiconductor devices the TAIKO process may not be used, but another backgrinding or other material-removal technique may be used, such as removing the material through a wet etch. In various implementations, the thinned portion 42 of the substrate 32 may be 50 um thick. In other implementations, it may be more or less than 50 um thick, including any die or substrate thickness previously disclosed herein.

Referring to FIG. 3E, the method for forming an SOI die may include etching the second side 36 of the substrate 32, or the thinned portion 42. In particular implementations, the etching may be stress relief etching. This stress relief etching may be used to obtain the final desired thickness of the wafer. The stress relief etching may include wet chemical etching. In other implementations, it may include dry etching or polishing instead of wet chemical etching, however, wet chemical etching may result in a cleaner substrate with less residual particles. Acid may be used to etch the substrate, and in various implementations may include, by non-limiting example, hydrofluoric acid, acetic acid, nitric acid, and any other acid or combination thereof. The wet chemical etch may be tightly monitored and controlled so that the targeted thickness of the wafer is achieved. In various implementations, the second side 36 of the substrate 32 may be etched until the thinned portion 42 of the substrate is 25 um thick. In other implementations, the substrate 32 may be etched until thinned portion 42 is more or less than 25 um thick. In implementations where the substrate is wet etched, the wet etch may prepare the substrate to better adhere to later deposited materials and/or devices. In various implementations, the backgrind tape 38 may be removed.

Referring to FIG. 3F, the method for forming an SOI die includes depositing an insulative layer 44 onto the second side 36 of the substrate 32 after backgrinding. In various implementations, the insulative layer 44 may be deposited at a low temperature. The low temperature deposition may allow for the insulative layer to be deposited without overheating the substrate, especially in instances where the substrate has been thinned. The substrate 32 may have a low thermal resistance. In various implementations, the insulative layer may be deposited through spin-on techniques, chemical vapor deposition (CVD), sputtering, evaporation, co-sputtering, or co-evaporation, and in particular implementations, may be deposited at a temperature that does not require heat dissipation. In implementations where the insulative layer is deposited using either co-sputtering or co-evaporation, the overall performance of the SOI die and the adhesion of the insulative layer 44 to the substrate 32 may be improved. In various implementations, however, the method may include dissipating heat through a heat dissipation device during deposition of the insulative layer 44. The heat dissipation device may include, among other devices, cooling chucks or common evaporators. The insulative layer 44 may be any insulative material previously disclosed herein, and may be applied in any thickness previously disclosed herein. In the implementation illustrated by FIG. 3F, the method includes depositing the insulative layer 44 directly to the second side 36 of the substrate 32. In other implementations, the method may include directly depositing a conductive layer to the second side of the substrate prior to deposition of the insulative layer. The conductive layer may enhance the adhesion between the insulative layer and the substrate as well as provide potential electrical contacts on the substrate. In such implementations, the conductive layer may include any electrically conductive material disclosed herein. In various implementations, the conductive layer may be deposited through, by non-limiting example, sputtering, evaporation, electroplating, any other deposition technique, or any combination thereof.

Referring to FIG. 3G, the method for forming an SOI die includes mounting the substrate 32 to a film frame. The first side 34 and/or the plurality of semiconductor devices 30 may be directly coupled to the film frame 46. Referring to FIG. 3H, the method may include removing the ring 40. The ring may be removed through grinding the ring portion of the substrate. In other implementations, the ring may be removed through plasma etching or cutting the ring from the remaining substrate using, by non-limiting example, a laser or a saw. In various implementations, the ring is removed to the extent that the backside 48 of the SOI substrate 50 opposite the side of the SOI substrate coupled to the film frame is substantially level.

Referring to FIG. 3I, the method for forming an SOI die includes applying a final dicing tape 52 to the backside 48 of the SOI substrate 50, or to the insulative layer 44. In such implementations, the method may also include removing the exposed tape used to couple the substrate 32 to the film frame explained in FIG. 3G. In other implementations, rather than applying the final dicing tape, the SOI substrate may be flipped so the insulative layer 44 is directly coupled to the existing tape.

Referring to FIG. 3J, the method for forming an SOI die may include singulating the substrate 32 (and the SOI substrate 50) into a plurality of SOI die 54. The SOI substrate may be singulated through, by non-limiting example, a saw 56, a laser, plasma etching, or any other singulation device or method. In various implementations, the SOI die may be coupled to an interposer after singulation.

Figure 4A:
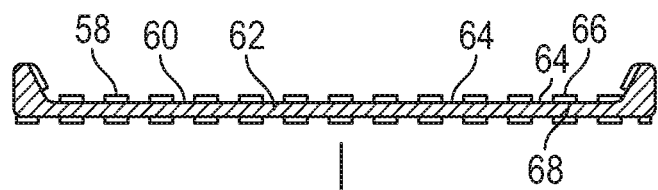
FIGS. 4A-4E are cross sectional side views of a second implementation of a method of forming an SOI die.

Referring to FIGS. 4A-4E, cross sectional side views of a second implementation of a method for forming an SOI die are illustrated. Referring specifically to FIG. 4A, the method may include patterning an insulative layer 58 coupled to a second side 60 of a substrate 62. As illustrated, the substrate 62 has been thinned to form a ring using any of the thinning methods disclosed in this document. In such implementations, the method includes masking the insulative layer and removing portions of the insulative layer where the mask pattern is absent. The SOI substrate 64 may be the same as or similar to the SOI substrate illustrated in FIG. 3F with the exception that the insulative layer 58 is patterned. The process used to produce the SOI substrate illustrated by and described in relation to FIG. 3F may also be used in making the SOI substrate with the patterned insulative layer illustrated in FIG. 4A.

In the implementation illustrated by FIG. 4A, the method includes depositing the insulative layer 58 directly onto the second side 60 of the substrate 62. In other implementations, the method may include directly depositing a conductive layer onto the second side of the substrate prior to deposition of the insulative layer. The conductive layer may enhance the adhesion between the insulative layer and the substrate as well as provide potential electrical contacts on the substrate. The conductive layer may be patterned. In still other implementations, the conductive layer may be deposited within recesses 64 formed in the patterned insulative layer 58. The conductive layer may also cover all of or a portion of a second side 66 of the insulative layer 58 opposite the first side 68 of the insulative layer. The conductive layer may include any conductive material disclosed herein. In various implementations, the conductive layer may be deposited through, by non-limiting example, sputtering, evaporation, electroplating, any other deposition technique, or any combination thereof.

Figure 4B:
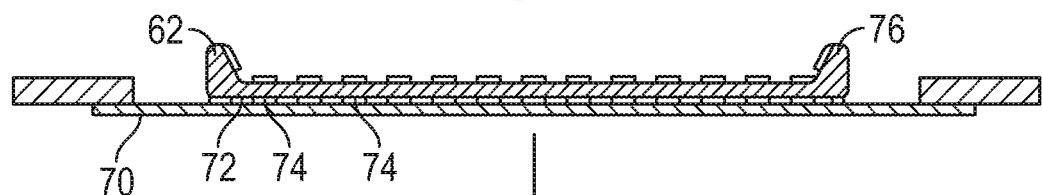
Figure 4C:
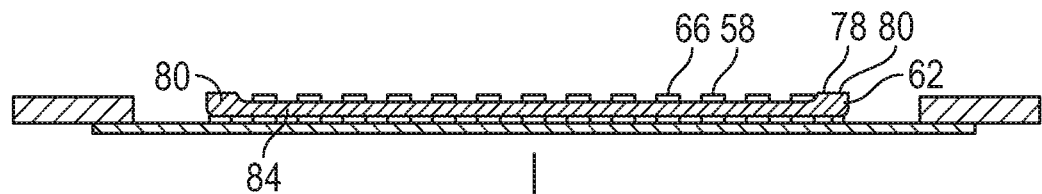

Referring to FIG. 4B, implementations of a method for forming an SOI die includes mounting the substrate 62 to a film frame 70. The first side 72 and/or the plurality of semiconductor devices 74 may be directly coupled to the film frame 70. Referring to FIG. 4C, the method may include removing the ring 76. The ring 76 may be removed through grinding the ring portion of the substrate or any other method disclosed in this document. In various implementations, the ring is removed to the extent that the second side 78 of the substrate 62 on the ends 80 of the substrate are substantially level with the second side 66 of the insulative layer 58.

Figure 4D:
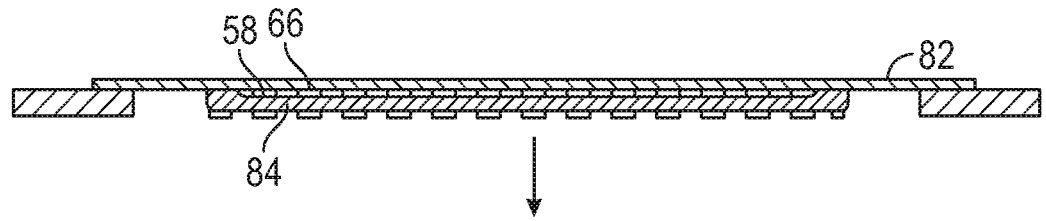

Referring to FIG. 4D, the method for forming an SOI die may include applying a final dicing tape 82 to the second side 66 of the insulative layer 58. In such implementations, the method may also include removing the exposed tape used to couple the substrate 62 to the film frame 70 as explained in relation to FIG. 4B. In other implementations, rather than applying the final dicing tape, the SOI substrate 84 may be flipped so the insulative layer 58 is directly coupled to the existing tape.

Figure 4E:
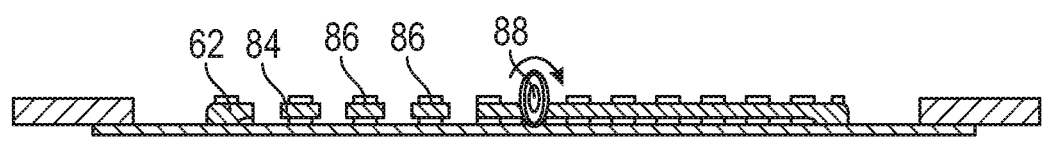

Referring to FIG. 4E, the method for forming an SOI die includes singulating the substrate 62 (and the SOI substrate 84) into a plurality of SOI die 86. The SOI substrate 84 may be singulated through, by non-limiting example, a saw 88, a laser, plasma etching, or any other singulation device or method. In various implementations, the SOI die may be coupled to an interposer after singulation.

The implementations of SOI substrates and SOI die disclosed herein may be formed without using a process that implants hydrogen within a substrate, without forming bubbles within the substrate, without breaking the substrate, and/or without having to polish the substrate. Further, the method may be performed without using a sacrificial carrier substrate and without having to cut, grind, or otherwise remove the sacrificial carrier substrate. The methods of forming such implementations of SOI die may have sufficient stress management of the backside insulating material to be able to form an SOI die without a sacrificial carrier substrate while still having a thin silicon layer coupled to the insulative layer. In this way, no remaining carrier material may be present in the resulting SOI die.

In places where the description above refers to particular implementations of SOI substrates/die implementing components, sub-components, methods and sub-methods, it should be readily apparent that a number of modifications may be made without departing from the spirit thereof and that these implementations, implementing components, sub-components, methods and sub-methods may be applied to other SOI substrates/die.

What is claimed is:

1. A method of making a plurality of semiconductor die, the method comprising:
    forming a ring around a perimeter of a second side of a silicon substrate through backgrinding the second side of the silicon substrate to a desired substrate thickness; and
    etching the second side of the silicon substrate after the backgrinding to relieve stress created in the second side of the silicon substrate through the backgrinding; and
    depositing an insulative layer onto the second side of the silicon substrate after stress relief etching.

2. The method of claim 1, further comprising
    removing the ring around the perimeter of the second side of the silicon substrate; and
    singulating the silicon substrate into the plurality of semiconductor die.

3. The method of claim 1, wherein the insulative layer is deposited using one of co-evaporation or co-sputtering.

4. The method of claim 1, further comprising dissipating heat through a heat dissipation device during deposition of the insulative layer.

5. The method of claim 3, wherein the one of co-evaporation or co-sputtering occur at temperatures that do not require heat dissipation.

6. The method of claim 1, wherein the desired substrate thickness is less than 35 microns.

7. The method of claim 1, wherein the insulative layer is deposited directly onto the second side of the silicon substrate after the stress relief etching.

8. The method of claim 1, further comprising singulating the silicon substrate into a plurality of silicon-on-insulator die.

9. A method of making a plurality of semiconductor die, the method comprising:
   backgrinding a second side of a silicon substrate to a desired substrate thickness; and
   stress relief etching the second side of the silicon substrate after the backgrinding; and
   depositing an insulative layer onto the second side of the silicon substrate after the stress relief etching.

10. The method of claim 9, further comprising
    forming a plurality of semiconductor devices on the first side of the silicon substrate, the first side opposite the second side of the silicon substrate; and
    singulating the silicon substrate into a plurality of semiconductor die.

11. The method of claim 9, wherein the insulative layer is deposited using one of co-evaporation or co-sputtering.

12. The method of claim 9, further comprising dissipating heat through a heat dissipation device during deposition of the insulative layer.

13. The method of claim 11, wherein the one of co-evaporation or co-sputtering occur at temperatures that do not require heat dissipation.

14. The method of claim 9, wherein the desired substrate thickness is less than 35 microns.

15. The method of claim 9, wherein the insulative layer is deposited directly onto the second side of the silicon substrate after the stress relief etching.

16. The method of claim 9, wherein the silicon substrate with the insulative layer forms a silicon-on-insulator (SOI) substrate.

17. A method of making a plurality of semiconductor die, the method comprising:
    backgrinding a second side of a silicon substrate to a first substrate thickness; and
    wet stress relief etching the second side of the silicon substrate after the backgrinding to a second substrate thickness less than 25 microns thick; and
    depositing an insulative layer onto the second side of the silicon substrate after the wet stress relief etching.

18. The method of claim 17, further comprising
    forming a plurality of semiconductor devices on a first side of the silicon substrate, the first side opposite the second side of the silicon substrate; and
    singulating the silicon substrate into the plurality of semiconductor die.

19. The method of claim 17, wherein the insulative layer is deposited directly onto the second side of the silicon substrate after the wet stress relief etching.

20. The method of claim 17, wherein the silicon substrate with the insulative layer forms a silicon-on-insulator (SOI) substrate.

\* \* \* \* \*